United States Patent
Maazouz et al.

(10) Patent No.: US 8,742,361 B2
(45) Date of Patent: Jun. 3, 2014

(54) FOCUSED CHARGED PARTICLE COLUMN FOR OPERATION AT DIFFERENT BEAM ENERGIES AT A TARGET

(75) Inventors: Mostafa Maazouz, Hillsboro, OR (US); Jonathan H. Orloff, Rockaway Beach, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 13/490,650

(22) Filed: Jun. 7, 2012

(65) Prior Publication Data

US 2013/0327952 A1     Dec. 12, 2013

(51) Int. Cl.
  *H01J 37/12*     (2006.01)
  *H01J 37/153*    (2006.01)
  *H01J 37/21*     (2006.01)
  *H01J 37/04*     (2006.01)

(52) U.S. Cl.
  CPC .............. *H01J 37/153* (2013.01); *H01J 37/21* (2013.01); *H01J 37/12* (2013.01); *H01J 37/04* (2013.01)
  USPC ..................................... 250/396 R; 250/309

(58) Field of Classification Search
  CPC ........... H01J 37/03; H01J 37/12; H01J 37/21; H01J 37/153
  USPC .............................................. 250/396 R, 309
  See application file for complete search history.

(56) References Cited

U.S. PATENT DOCUMENTS

| | | | |
|---|---|---|---|
| 5,187,371 A * | 2/1993 | Matsui et al. | 250/396 R |
| 6,693,282 B1 | 2/2004 | Tiemeijer | |
| 7,956,336 B2 * | 6/2011 | Kaga | 250/492.21 |
| 2003/0006377 A1 * | 1/2003 | Nomura | 250/396 R |
| 2009/0302233 A1 * | 12/2009 | Ogawa | 250/396 R |
| 2012/0001086 A1 * | 1/2012 | Ogawa | 250/396 R |
| 2012/0168638 A1 | 7/2012 | Parker | |
| 2012/0205550 A1 * | 8/2012 | Drexel | 250/396 ML |
| 2013/0009070 A1 * | 1/2013 | Onoguchi et al. | 250/396 R |

FOREIGN PATENT DOCUMENTS

| | | |
|---|---|---|
| JP | S62108442 | 5/1987 |
| JP | H10241616 | 9/1998 |

OTHER PUBLICATIONS

Kurihara, K., "Low-Aberration Einzel Lens for Focused-Ion-Beam System" Japanese Journal of Applied Physics, vol. 24, No. 2, Feb. 1985 pp. 225-300.*

Burghard, R., et al., "Performance comparison of electrostatic lenses for field emission ion and electron sources" J. Vac. Sci. Technol. A 5 (3), May/Jun. 1987.*

Aihara, R. et al., "Optical system for a low-energy focused ion beam," Journal of Vacuum Science & Technology B, 1989, 4 pages, vol. 7, Issue 1.

(Continued)

*Primary Examiner* — Jack Berman
*Assistant Examiner* — Wyatt Stoffa
(74) *Attorney, Agent, or Firm* — Scheinberg & Assoc., PC; Michael O. Scheinberg

(57) ABSTRACT

A charged particle column having improved performance at multiple beam energies. The column employs a four-element objective lens to enable improved beam focusing performance at both high and low beam energies at a target, with differing focus voltage configurations for different beam energies. By changing the voltages applied to the four electrodes of the objective lens, different focusing conditions may be rapidly configured, enabling rapid toggling between optimized imaging and optimized processing of a target.

18 Claims, 9 Drawing Sheets

(56) References Cited

OTHER PUBLICATIONS

Burghard, Ronald A., et al., "Performance comparison of electrostatic lenses for field emission ion and electron sources," Journal of Vacuum Science & Technology A, May 1987, pp. 364-371, vol. 5, Issue 3.

Kasahara H., et al., "A 0-30 keV low-energy focused ion beam system," Journal of Vacuum Science & Technology B, May 1988, pp. 974-976, vol. 6, Issue 3.

Kawanami, Yoshimi, et al., "Design of a high-current-density focused-ion-beam optical system with the aid of a chromatic aberration formula," Journal of Vacuum Science & Technology B, 1990, 3 pages, vol. 8, Issue 6.

Kurihara, Kenji, "Aberration due to misalignment in electrostatic lens and deflection systems," Journal of Vacuum Science & Technology B, 1990, 4 pages, vol. 8, Issue 3.

Kurihara, Kenji, "Low-Aberration Einzel Lens for a Focused-Ion-Beam System," Japanese Journal of Applied Physics, Feb. 1985, pp. 225-230, vol. 24, No. 2.

Saito, Kenichi, et al., "An accel-mode einzel lens with through-lens energy analyzer for electron beam testing," Journal of Vacuum Science & Technology A, Mar. 1990, pp. 769-774, vol. 8, Issue 2.

Tsumagari, Takashi, et al., "Design of a low-aberration lens for focused ion beams," Journal of Vacuum Science & Technology B, 1988, 4 pages, vol. 6, Issue 3.

* cited by examiner

US 8,742,361 B2

FOCUSED CHARGED PARTICLE COLUMN FOR OPERATION AT DIFFERENT BEAM ENERGIES AT A TARGET

TECHNICAL FIELD OF THE INVENTION

The present invention relates generally to focused charged particle beam columns and, in particular, to charged particle beam columns configured for operation at different beam energies at a target.

BACKGROUND OF THE INVENTION

In charged particle systems, comprising both electron microscopes and focused ion beam systems, a column is typically used to focus a charged particle beam onto the surface of a target which is to be imaged and/or processed using the beam. The energy of the beam when it strikes the target surface influences the beam interaction with the substrate and also the characteristics of the image acquired. For example, some imaging applications require the highest spatial resolutions in order to spatially resolve the smallest features on the target, in some cases down to atomic resolution. In other imaging applications, it is necessary to use lower beam energies to reduce damage to the target or to image only the surface of the target (since higher energy beams typically penetrate deeply into the target).

Similar considerations apply for beam-enhanced processing of targets, such as ion milling, beam-induced deposition or etching (using either electrons or ions), ion polishing, ion implantation, etc. For all these processing methods, the beam energy when it encounters the target surface may have substantial effects on the characteristics of the process, including the spatial resolution (i.e., the size of the milled or deposited features), as well as the processing rate, surface smoothness, density of depositions, depth of damaged layers, etc.

A common characteristic of charged particle columns is the beam voltage at which the optical design was optimized, where "optimization" may correspond to the focusing ability of the column to produce the smallest possible beam diameter for a pre-determined beam current, or the highest beam current within a pre-determined beam diameter. When a range of beam energies at the target is desired (e.g., when both imaging and processing are to be performed on the same target), the best performance for imaging or processing can typically only be obtained for beam energies near this optimized beam energy. For all other beam energies, the imaging or processing performance is lower than would have been possible had the column been optimized for the particular beam energy. "Lower performance" in this context would mean a larger beam diameter for a pre-determined beam current, or a lower beam current within a pre-determined beam diameter, while "improved performance" will be used to mean a smaller beam diameter for a pre-determined beam current, or a higher beam current within a pre-determined beam diameter.

What is needed is a charged particle column having improved performance at multiple beam energies. Another desirable goal would be to configure a charged particle column for improved performance over a wider range of energies, spanning those energies which have been determined to be optimal for imaging and also beam energies which have been determined to be optimal for beam processing applications.

SUMMARY OF THE INVENTION

An object of the invention is to configure a charged particle column to focus a charged particle beam (either electrons or ions) onto a target over a wider range of beam energies while maintaining smaller beam diameters for pre-determined beam currents and/or while focusing larger beam currents into pre-determined beam diameters. According to some embodiments of the invention, a four-element electrostatic objective lens provides multiple operating modes, wherein some modes enable improved performance at lower beam energies, while other modes enable improved performance at higher beam energies. By changing the voltages applied to the four electrodes of the electrostatic objective lens, different focusing conditions may be rapidly configured, enabling frequent "toggling" between optimized imaging and optimized processing of a target.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

The present invention applies to charged particle systems employing focused beams of charged particles (electrons or ions) to image and/or process a target. These systems typically employ a charged particle source to form an initial beam which is then accelerated, focused, blanked, and deflected by electrostatic and (optionally) magnetic elements within the column such as lenses, blankers, and deflectors. Usually, a first (condenser) lens is positioned near the ion source to control the angular distribution of ions passing down into the remainder of the column. A second (objective) lens is commonly located near the target surface to focus the ion beam formed by the condenser lens onto the target surface. The target may be imaged, milled, polished, etched, deposited on, or otherwise processed by the interaction of the ion beam with the target. In some cases, one or more "process gases" may be introduced (typically using nozzles) into the vicinity of the beam intersection with the target surface to induce deposition or etch processes in conjunction with the energy and/or momentum imparted to the target surface by the ion beam.

The present invention can be applied to charged particle columns employing electrostatic objective lenses to optimize the optical design at both a high beam voltage (e.g., approximately 30 keV) and also at a low beam voltage (e.g., approximately 2 keV) for various applications. For example, some imaging processes may induce less damage to the target if the beam has a lower energy. Conversely, imaging resolution is typically improved at higher beam energies. Similarly, some target processing methods may require lower energies (e.g., to reduce amorphization depths), while other processing methods may be optimized at higher beam energies (e.g., to improve the spatial resolution). In all these imaging and processing examples, it is often preferred to focus the beam to as small a diameter as possible for a pre-defined beam current, or to concentrate the maximum amount of beam current into a pre-defined beam diameter. Thus, an object of the invention is to configure an ion column to achieve improved beam focusing onto a target surface for both higher and lower beam energies by means of a four-element electrostatic objective lens with multiple operating modes as described in FIGS. 4-6, below.

The actual beam energies at which the column is optimized will vary according to the desired applications. Thus, as used herein, "lower beam energies" will mean the beam voltage desired for a low beam energy application, while "higher beam energies" will refer to the beam voltage desired for a high beam energy application. According to preferred embodiments of the present invention, the actual numerical value of the high beam energy at which the column is optimized and the numerical value of the low beam energy at which the column is optimized will have a ratio of at least 3 to 1.

Figure 1:
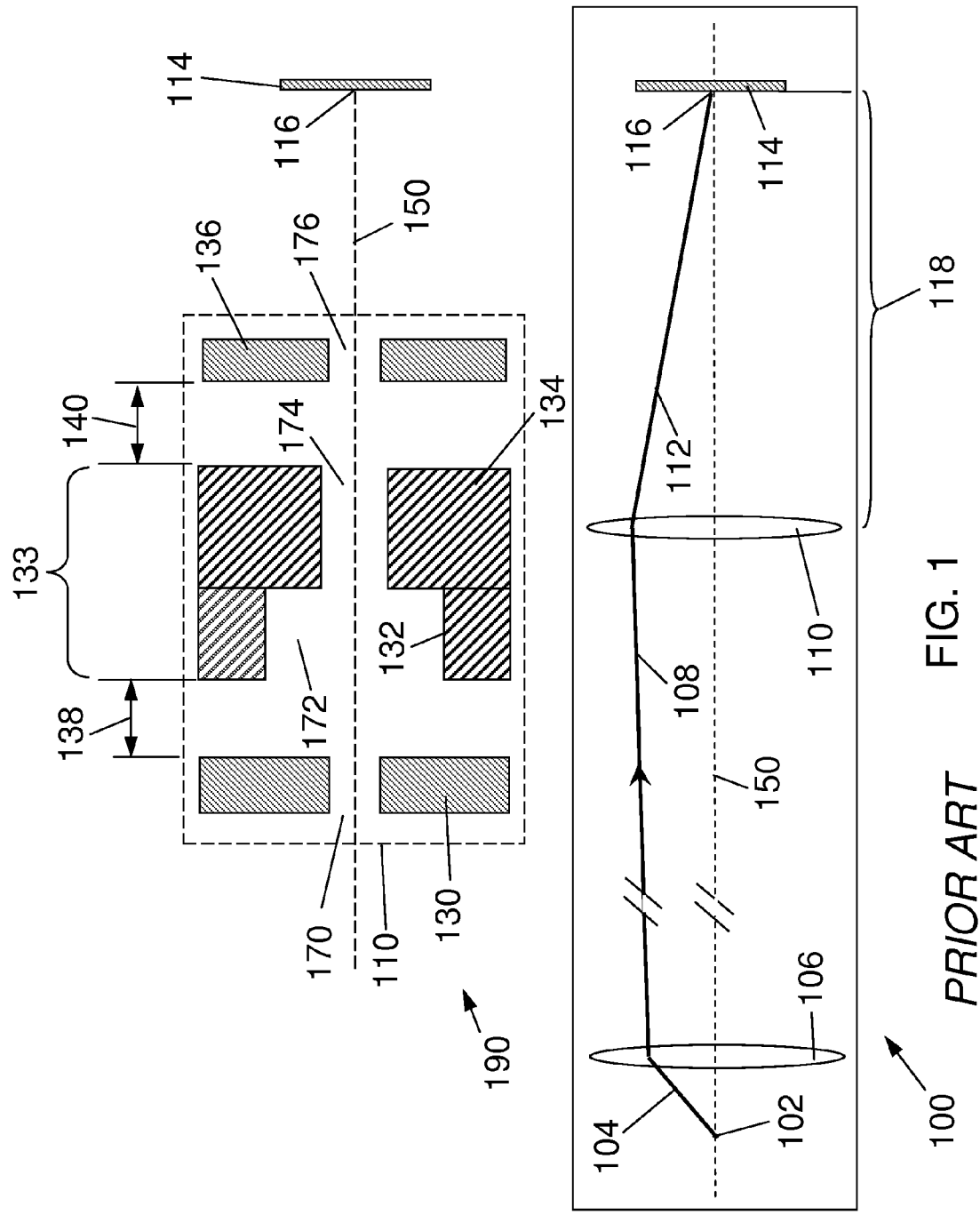
FIG. 1 shows a schematic diagram of a prior art charged particle column with a three-element electrostatic objective lens.

FIG. 1 shows a schematic diagram of a prior art charged particle column 100 with a three-element electrostatic objective lens 110. Ions are emitted from a source 102, with an exemplary emission trajectory 104 leaving at an angle relative to the optical axis 150. Condenser lens 106 then focuses the ions into a roughly parallel beam 108, directed down ion column 100 towards the objective lens 110. Other known optical elements such as blankers, apertures, deflectors, which typically may be included in ion column 100 are not shown here for clarity. Objective lens 110 deflects trajectory 108 into a converging beam 112, focused to a location 116 on the surface of a target 114, as shown. The working distance 118 represents the distance between the lower end of objective lens (i.e., the end closest to the target 114) 110 and the target 114.

Typically, shorter working distances 118 allow the production of smaller beam diameters (with higher beam current densities) at location 116 than do longer working distances. However, shorter working distances may be disadvantageous in terms of detector collection efficiencies due to interference between the lower end of the column and the detector. In dual-beam systems, shorter working distances may also cause interference between the imaging beam (typically an electron beam from a scanning electron microscope column) and the processing beam (typically an ion beam from a focused ion beam column). A further disadvantage of shorter working distances 118 may occur for beam processing applications employing process gases, where the diffusion of the process gas into the electrostatic objective lens may impair the high voltage standoff between lens electrodes (e.g., between electrodes 130 and 133, or between electrodes 133 and 136).

The upper portion of FIG. 1 shows a schematic diagram 190 of the three electrodes 130, 133, and 136 in the objective lens 110 in column 100. In this prior art column, the second electrode 133 comprises two sub-electrodes 132 and 134, which are typically at the same voltage. In FIG. 1, electrodes 130 and 136 are at ground potential (i.e., at the target voltage), while electrodes 132, 134, and 133 are at non-ground potential (i.e., non-zero) voltages. The electric fields induced between the ground-potential electrodes and the non-ground potential electrodes cause the focusing effects on the ions as illustrated by the bending of trajectory 104 to trajectory 108, and the bending of trajectory 108 to trajectory 112. Objective lens 110 comprises three electrodes:

1) A first (typically grounded) electrode 130, with bore 170 through which the ions pass into lens 110,
2) A second (typically non-grounded) electrode 133 comprising two sub-electrodes: a first sub-electrode 132 with a larger bore 172, contiguous with a second sub-electrode 134 having a smaller bore 174,
3) A third (typically grounded) electrode 136 with a bore 176 through with the ions exit from lens 110.

The sizes of gap 138 between electrode 130 and sub-electrode 132 and gap 140 between sub-electrode 134 and electrode 136 are determined from the required focusing voltage on electrode 133 based on a conventional rule of 10 kV/mm maximum inter-electrode field strength.

Figure 2:
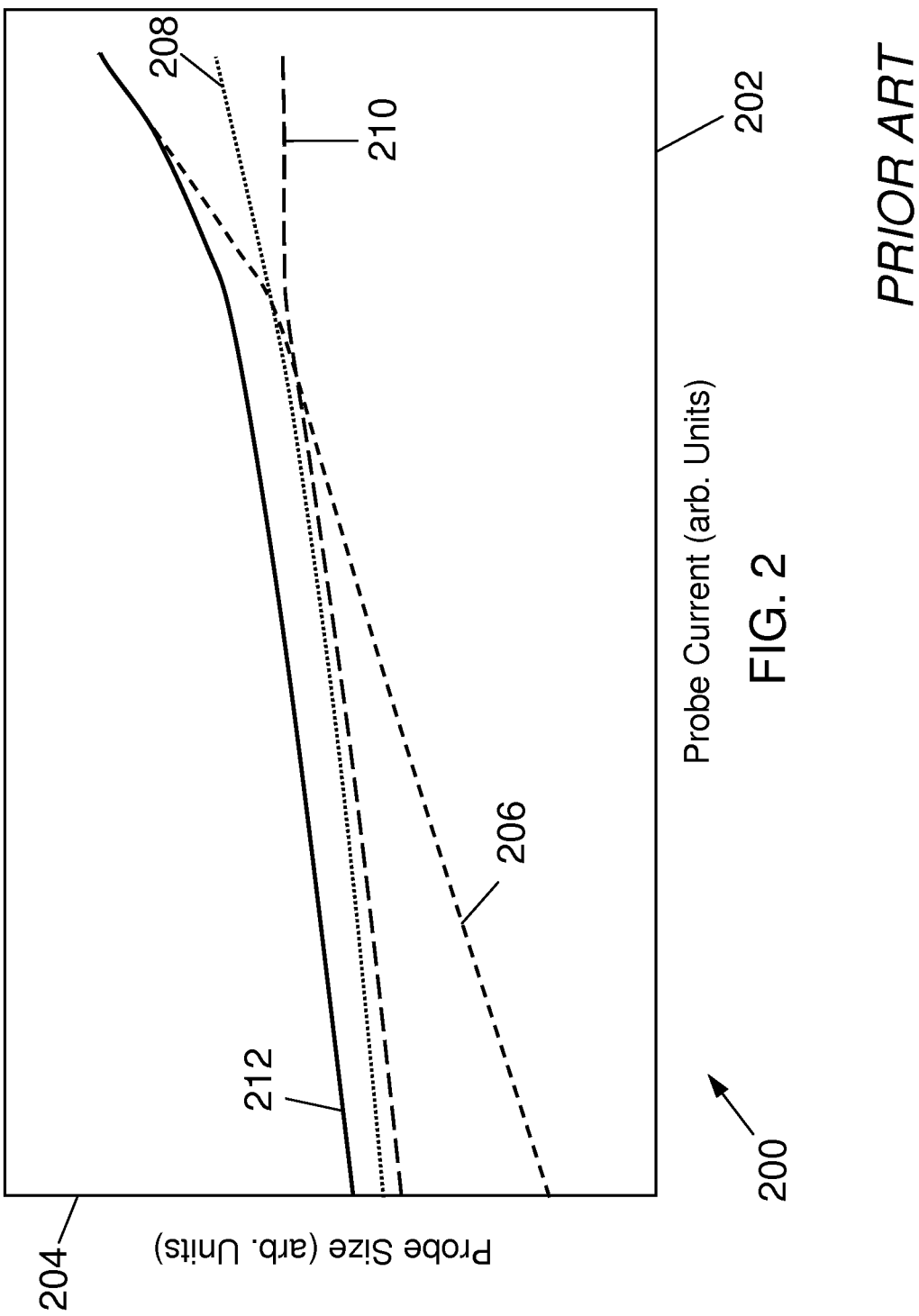
FIG. 2 is a schematic graph of the probe size relative to the beam (probe) current for the prior art charged particle column of FIG. 1 operating at 30 keV beam energy at a target.

FIG. 2 is a schematic graph 200 of the probe size 204 relative to the beam (probe) current 202 for the prior art charged particle column 100 of FIG. 1 operating at 30 keV beam energy at the target 114, where coulomb (space-charge) effects have not been taken into account. For all beam currents in ion beam systems, there are three main contributions to the total probe size:

1) Source Size 210—this is the contribution of the (demagnified) virtual source size to the focused spot at the target. At the lower probe currents for prior art column 100, this is one of the two main contributions (along with chromatic aberration 208) to the final probe size. This effect varies with the overall column magnification from the source to the target, and is independent of the beam half-angle subtended at the target and the beam energy spread.
2) Chromatic Aberration 208—this is the contribution of the chromatic on-axis aberration due to both the condenser lens 106 and objective lens 110 at the target. Along with source size 210, for lower beam currents this effect is dominant. Chromatic aberration is proportional to the beam half-angle subtended at the target, and also to the ratio of the beam energy spread to the beam energy.
3) Spherical Aberration 206—this aberration is caused by the shapes of the focusing fields in the condenser 106 and objective 110 lenses and is proportional to the cube of the beam half-angle at the target. For larger probe currents, this may be the dominant contribution to the probe size at the target.

The total probe size 212 is characterized by the diameter within which 50% of the total beam current falls—the "d50" diameter, as plotted along axis 204 in arbitrary units. The total probe size 212 is a combination of the above three main contributions 206, 208, and 210, with very minor additional contributions from diffraction in the case of ions. For electron beams, diffraction is a more significant contribution to d50 due to the larger wavelengths of electrons relative to all ions. The present invention applies to both ions and electrons, although the examples cited herein correspond to ion beams.

Figure 3:
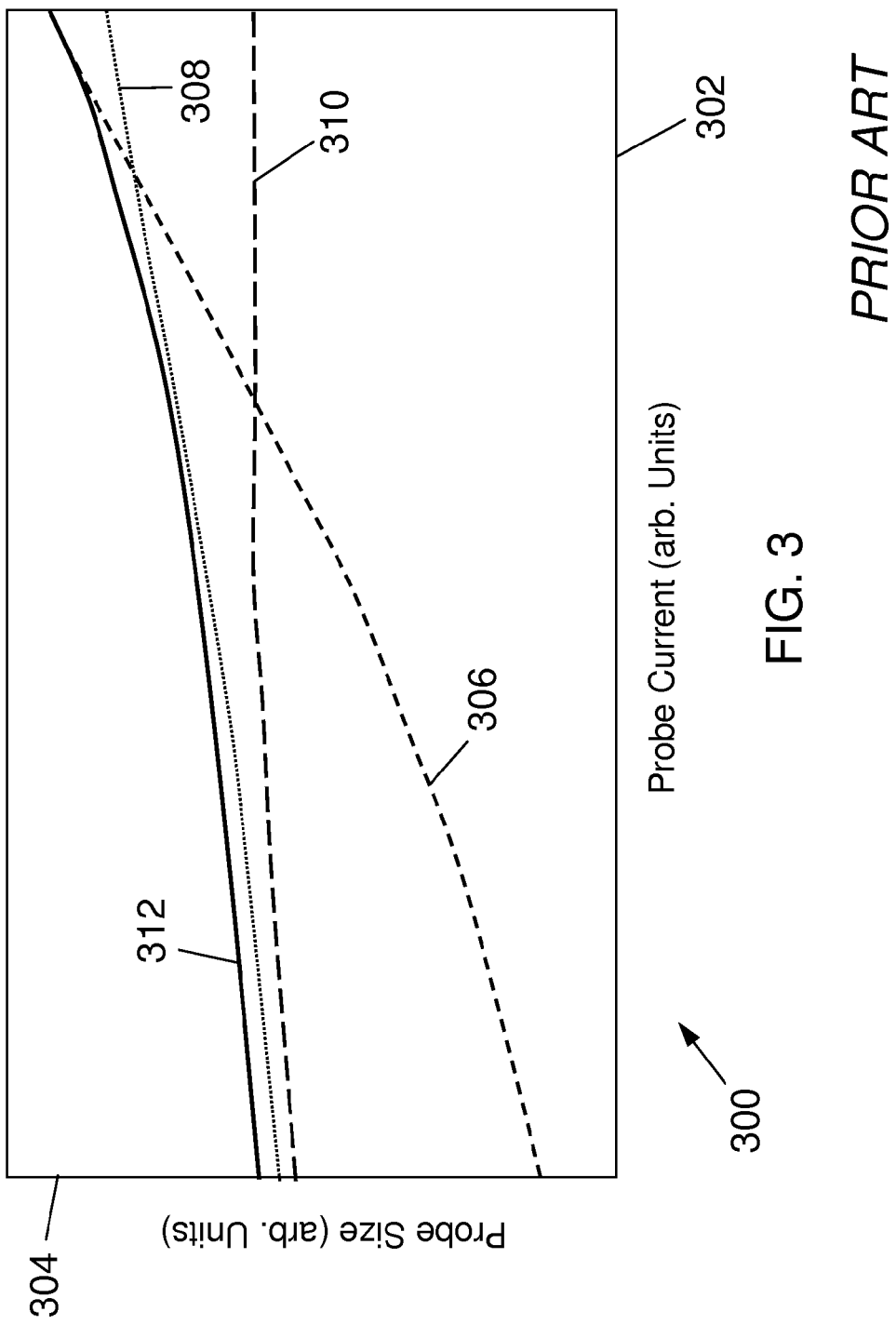
FIG. 3 is a schematic graph of the probe size relative to the beam (probe) current for the prior art charged particle column of FIG. 1 operating at 2 keV beam energy at a target.

FIG. 3 is a schematic graph 300 of the probe size 304 relative to the beam (probe) current 302 for the prior art charged particle column 100 of FIG. 1 operating at 2 keV beam energy at the target 114, where coulomb (space-charge) effects have not been taken into account. As in FIG. 2, the main contributions to the total probe size 312 arise from the source size 310, chromatic aberration 308, and spherical aberration 306. At this lower beam energy ($1/15\times$ of that illustrated in FIG. 2), chromatic aberration is proportionately larger since the ratio of the beam energy spread (which is unaffected by the beam energy) to the beam energy is 15× larger. Curve 308 is thus seen to be substantially higher relative to curves 306 and 310 on graph 300 than curve 208 is relative to curves 206 and 210 on graph 200.

As a result, for a wider probe current range, chromatic aberration 308 is the dominant contributor to probe size, in most cases at least several times larger than the source size contribution 310. Due to the different electrostatic field distributions within objective lens 110 required for focusing the two beam energies, at higher probe currents, spherical aberration may also increase.

In general, in the prior art, an objective lens, such as lens 110 in FIG. 1, comprising three-electrodes, could not be fully optimized for operation at both high (e.g., approximately 30 keV) and low (e.g., approximately 2 keV) beam operation. In the example shown here, the objective lens 110 was optimized for 30 keV operation, and consequently the probe diameters formed on target 114 as shown in FIG. 2 are larger than would be the case if lens 110 were to be redesigned for optimal operation at 2 keV. However, re-optimization of lens 110 for 2 keV operation would typically degrade (i.e., increase) the probe diameters formed at 30 keV. An object of the present invention is to provide an objective lens structure and design method enabling improved probe formation at both high and low beam energies using a four-element electrostatic lens with multiple focusing voltage configurations, selected depending on the desired beam energy at the target.

Figure 4:
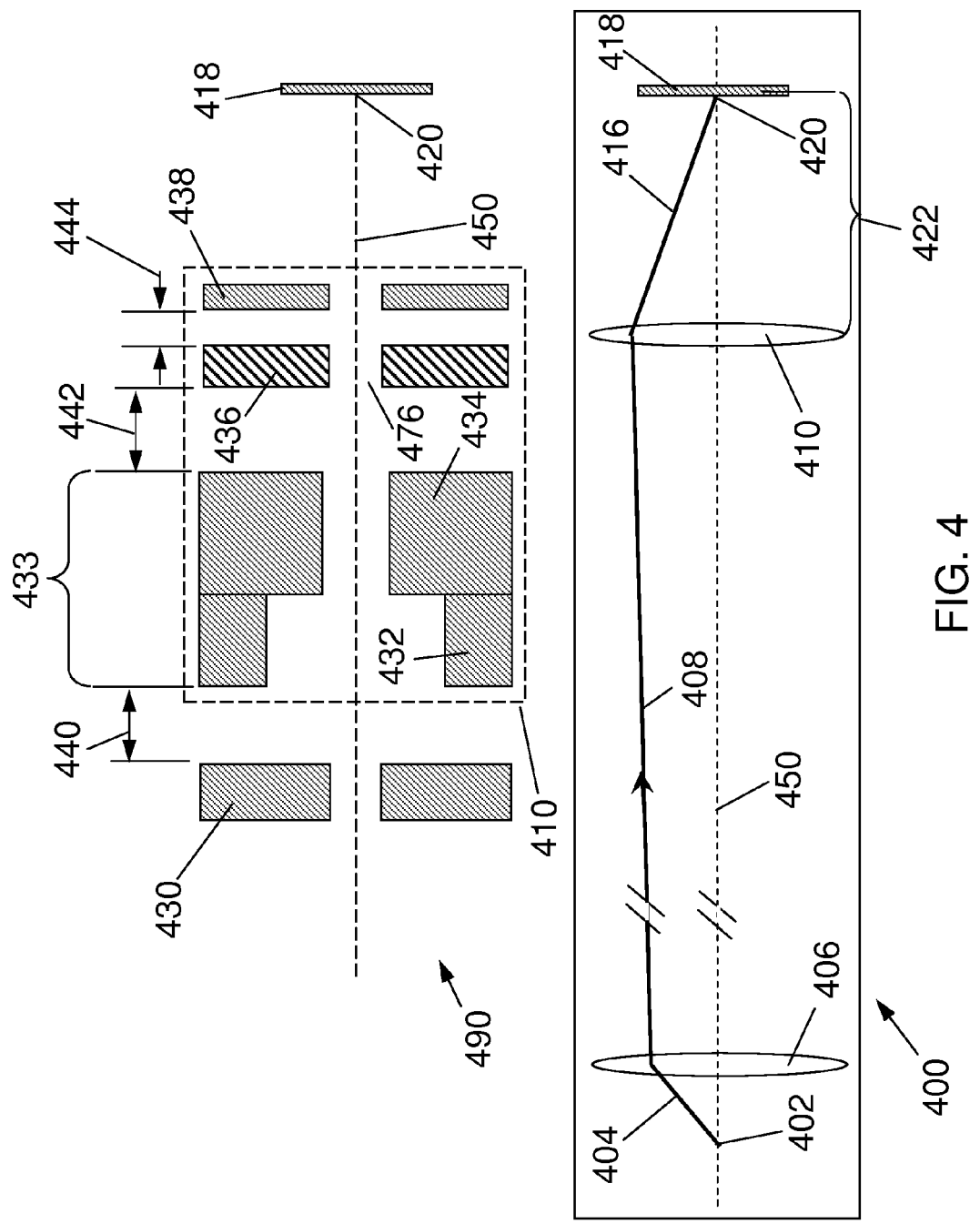
FIG. 4 is a schematic diagram of a charged particle column according to a preferred embodiment of the present invention operating at 2 keV beam energy at a target.
Figure 5:
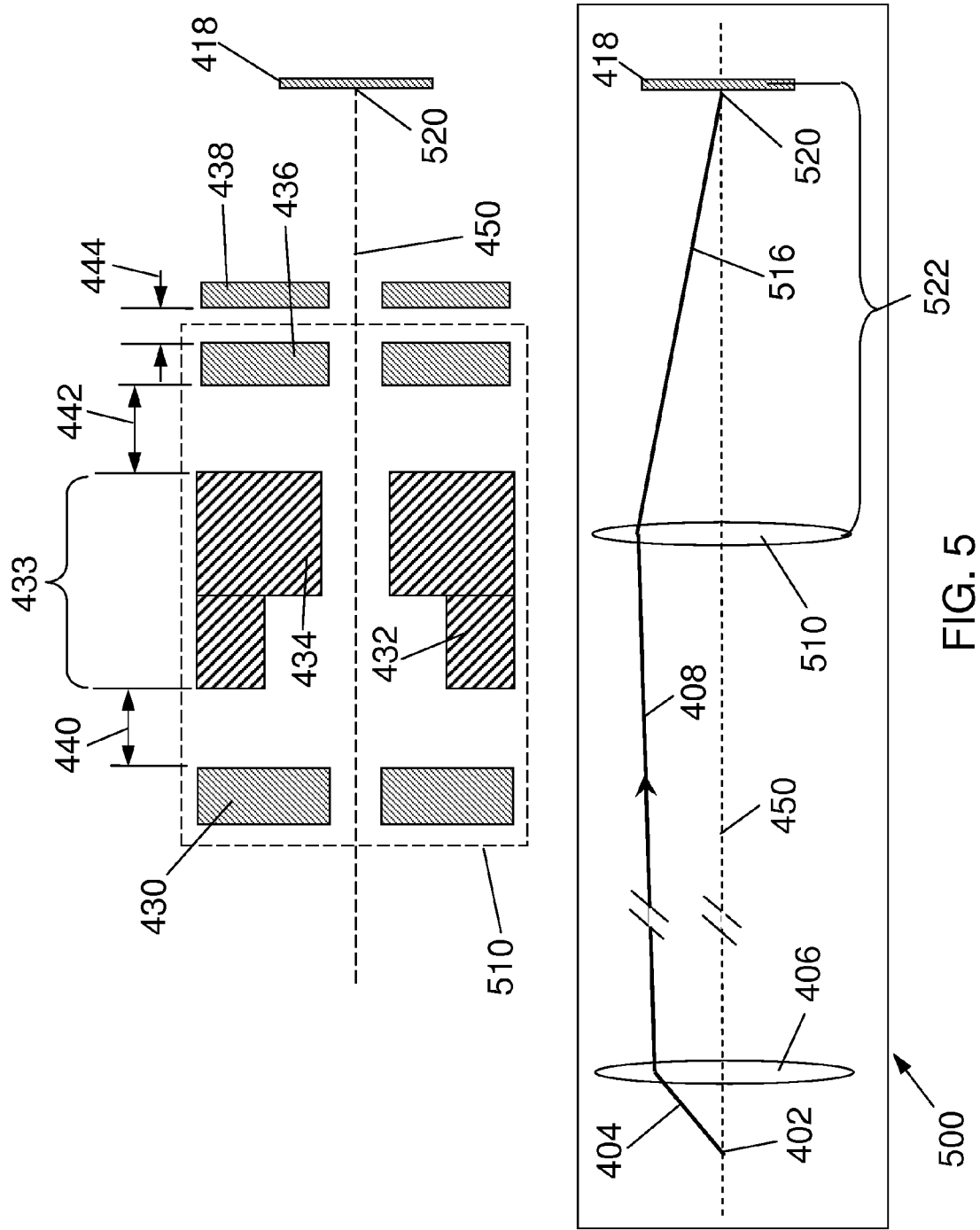
FIG. 5 is a schematic diagram of a charged particle column according to a preferred embodiment of the present invention operating at 30 keV beam energy at a target.
Figure 6:
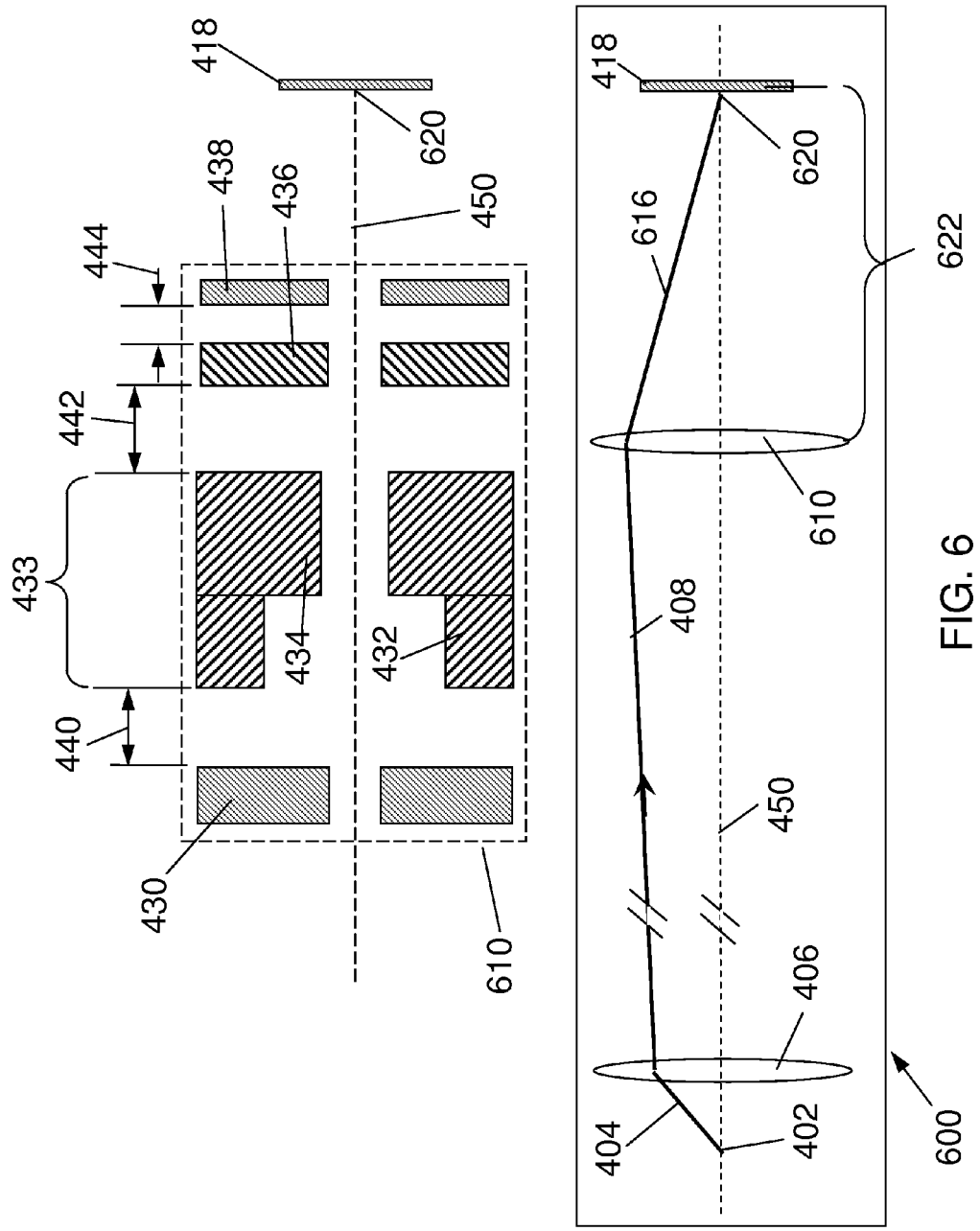
FIG. 6 is a schematic diagram of a charged particle column according to a preferred embodiment of the present invention operating at a beam energy between 2 and 30 keV at a target.

FIGS. 4-6 illustrate a charged particle column according to preferred embodiments of the present invention with an objective lens comprising four electrodes. In preferred embodiments of the invention, a four-electrode lens can be configured to boost the performance of the charged particle column at low energy without affecting its performance at the high energy. The four electrode lens preferably operates in a switchable mode depending on the beam energy. For a high energy beam, the lens effect can be generated by the first three electrodes, while the last three electrodes can be used to create the lens effect for a low energy beam.

In the preferred embodiment of FIGS. 4-6, each of the four electrodes 430, 433, 436, and 438, is preferably centered on the optical axis 450 of the charged particle beam column 400 so that the charged particle beam passes through bores in each electrode. The electrodes are positioned sequentially one through four, with the first electrode being closest to the charged particle source 402 and the fourth electrode 438 being closest to the target 418. The first electrode 430 and the fourth electrode 438 are preferably at ground potential (the same voltage as the target 418). In some circumstances there could be a voltage applied to either or both of these electrodes 430 and 438, but it is preferable that the voltages be substantially the same. By "substantially the same" it is meant that the voltage difference between these two electrodes 430 and 438 or between either of the electrodes 430 or 438 and the target 418 be relatively small (for example, less than 200 volts) when compared to the voltage difference used as a focusing voltage (which is typically on the order of thousands of volts).

In an objective lens 410 according to the present invention, at least one of the second 433 and third 436 electrodes is maintained at a voltage that is different from the voltage of the first 430 and fourth 438 electrodes. As in the prior art objective lens described above, the electric fields induced by this voltage difference cause focusing effects on the charged particles. Typically, the voltage difference will be on the order of thousands of volts. For example, in a typical configuration, the first 430 and fourth 438 electrodes would be maintained at ground potential (0 volts) and one of the second 433 or third electrodes 436 maintained at 5,000 volts (as discussed below, while the other of the second 433 or third 436 electrodes is preferably maintained at the same voltage as the first 430 and fourth 438 electrodes).

According to the present invention, the voltages on the second 433 and third 436 electrodes can be adjusted to allow the objective lens 410 to be "switched" between at least three different modes, as indicated by lenses 410, 510, and 610, in FIGS. 4-6, respectively. The second electrode 433 (comprising sub-electrodes 432 and 434, described below) and the third electrode 436 can have various voltages, depending on the operating mode. For example, a charged particle column 400 according to a preferred embodiment of the present invention could be operated in the following three different operating modes:

1) Lowest Beam Energy Mode (e.g., 2 keV)—the focusing voltage is preferably only on electrode 436, and electrode 433 is grounded,
2) Highest beam Energy Mode (e.g., 30 keV)—the focusing voltage is preferably only on electrode 433, and electrode 436 is grounded,
3) Intermediate Beam Energy Mode (i.e., between 2 and 30 keV)—focusing voltages are preferably applied to both electrodes 433 and 436 (but not necessarily the same voltage).

FIG. 4 is a schematic diagram of a charged particle column 400 according to a preferred embodiment of the present invention operating at 2 keV beam energy at a target 418. Ions are emitted from a source 402, with an exemplary emission trajectory 404 leaving at an angle relative to the optical axis 450. Condenser lens 406 focuses the ions 404 into a roughly parallel beam 408, directed down ion column 400 towards objective lens 410. Objective lens 410 then focuses the ions 408 into a converging beam 416 focused onto target 418 at a location 420. Other optical elements such as blankers, apertures, deflectors, which typically might be comprised in ion column 400 are not shown here for clarity.

In the embodiment of FIG. 4, the charged particle column is being operated in the "Lowest Beam Energy Mode," discussed above. In this mode, second electrode 433 (which may be formed from two sub-electrodes 432 and 434) is at ground potential, just like the first 430 and fourth 438 electrodes. The third electrode 436, however, is maintained at a non-ground potential. The voltage difference (or focusing voltage) generates electric fields between second electrode 433 (specifically sub-electrode 434) and third electrode 436, and between electrodes 436 and 438 that are great enough to bend the trajectory of the charged particle passing through the fields so that the charged particles are focused onto the target as illustrated by the transition from trajectory 408 to trajectory 416 due to lens 410 in the column diagram 400 at the bottom of FIG. 4.

Because the charged particle column configuration of FIG. 4 is intended for use with a low energy beam, the gap between the third electrode 436 and the fourth electrode 438 can be made smaller than the gaps between the first and second electrodes and between the second and third electrodes. This is because lower electric field strengths are needed to focus lower energy charged particles. A much greater difference in potential between the electrodes is needed to focus high-energy particles, and a greater difference in potential requires a greater distance between the electrodes to prevent arcing. In the embodiment shown in FIG. 4, the charged particle column is used to focus a 2 keV beam. As a result, the gap 444 between the third and fourth electrodes may be approximately a third the size of gaps 440 and 442. (The sizes of gaps 440 and 442 are determined by the focusing voltages required for higher energy beams, as in FIGS. 5 and 6, below.)

The small gap between the third electrode 436 and the fourth electrode 438 mode pushes the focusing point of the objective lens 410 closer to the target 418, giving the minimum possible working distance 422. As in the prior art, shorter working distances 422 typically allow the production of smaller beam diameters (with higher beam current densities) at location 420 on target 418 than do longer working distances. Although the minimum sizes of all of the gaps 440, 442, and 444 are determined by the focusing voltages required for a particular application, in preferred embodiments of the present invention, the gap between the third and fourth electrodes will be no more than ⅓ the size of the other gaps (440 and 442). Significantly, the size of gap 444 and the electrode voltages can be optimized for a desired low energy beam using prior art methods.

The charged particle beam column of FIG. 4 is not limited to being optimized for low energy particle, however. The column 400 can also be switched to Highest Beam Energy Mode and optimized for a higher beam energy. According to preferred embodiments of the present invention, this switch is accomplished, for example, by causing a voltage supply (not shown) to change the voltage on the third electrode 436 to substantially match the voltages on the first 430 and fourth 438 electrodes (for example, to within a few hundred volts as described above) and to change the voltage on the second electrode 433 to a focusing voltage.

FIG. 5 is a schematic diagram of a charged particle column 500 that is operating in Highest Beam Energy Mode for 30 keV beam energy. In this mode, third electrode 436 is at ground potential, just like the first 430 and fourth 438 electrodes. In the embodiment shown in FIG. 4, second electrode 433 comprises sub-electrodes 434 and 432, which are in electrical contact with each other. (The use of such sub-electrodes is known in the prior art and can be used to produce an electrode having a desired shape.) Second electrode 433 has the focusing voltage applied, which generates electric fields between electrode 430 and sub-electrode 432, and between sub-electrode 434 and third electrode 436. These electrical fields result in the objective lens of FIG. 5 having a focusing plane 510 that is farther from the target as compared to the location of objective lens 410 of FIG. 4. This results in a larger working distance 522 above the target 418, consistent with a larger magnification (or smaller demagnification) between the source 402 and the target 418. As in FIG. 4, condenser lens 406 focuses the ions 404 into a roughly parallel beam 408, directed down ion column 500 towards objective lens 510. Objective lens 510 then focuses the ions 408 into a converging beam 516 focused onto target 418 at a location 520 which may be near to, or coincide with, location 420 in FIG. 4.

As in the prior art, longer working distances correspond to larger magnifications (i.e., smaller demagnifications) between the source and the target. The sizes of gap 440 between electrode 430 and sub-electrode 432, and gap 442 between sub-electrode 434 and electrode 436 are chosen according to the larger focusing voltages required to focus higher energy ion beams, based on the conventional value of 10 kV/mm maximum inter-electrode field strength. Because the sizes of gaps 442 and 440 will have little effect upon the focusing of a low energy beam in the mode of FIG. 4, the focusing voltages and sizes of gaps 440 and 442 can be optimized for a particular high beam energy (for example, 30 keV) without affecting the optimization of the column for the mode shown in FIG. 4. Thus, the charged particle beam column shown in FIGS. 4 and 5 can be easily switched from a mode that is optimized for a low beam energy to a mode that is optimized for a high beam energy by changing the distribution of voltages applied to electrodes 433 and 436 with no changes to the dimensions of any of electrodes 430, 433, 436, or 438. In contrast to prior art columns, embodiments of the present invention allow the charged particle column to produce the smallest possible beam diameter for a predetermined low beam energy while also producing the smallest possible beam diameter for a predetermined high beam energy. According to embodiments of the present invention, the charged particle beam column of FIGS. 4 and 5 can also be operated with a focusing voltage applied to both second electrode 433 and third electrode 436 for use with beam energies between the optimized low and high beam energies.

FIG. 6 is a schematic diagram of a charged particle column 400 according to a preferred embodiment of the present invention operating at a beam energy between 2 and 30 keV at the target 418. In this mode, both electrodes 433 and 436 have focusing voltages applied, generating focusing electric fields between electrode 430 and sub-electrode 432, between sub-electrode 434 and third electrode 436, and between electrodes 436 and 438. Operating in this mode positions the objective lens 610 to a working distance 622 above the target 418 intermediate between the smaller working distance 422 in FIG. 4 and the longer working distance 522 of FIG. 5. As in FIGS. 4 and 5, ions are emitted from a source 402, with an exemplary emission trajectory 404 leaving at an angle relative to the optical axis 450. Condenser lens 406 focuses the ions into a roughly parallel beam 408, directed down ion column 400 towards the objective lens 610. Objective lens 610 then focuses the ions 408 into a converging beam 616 focused onto the target 418 at a location 620.

Although FIGS. 4-6 show the same ion beam 408 entering the respective objective lenses 410, 510 and 610, differing ion beams emerging from the condenser lens 406 for different beam energies at the target (i.e., for FIGS. 4 to 6) are also possible.

Figure 7:
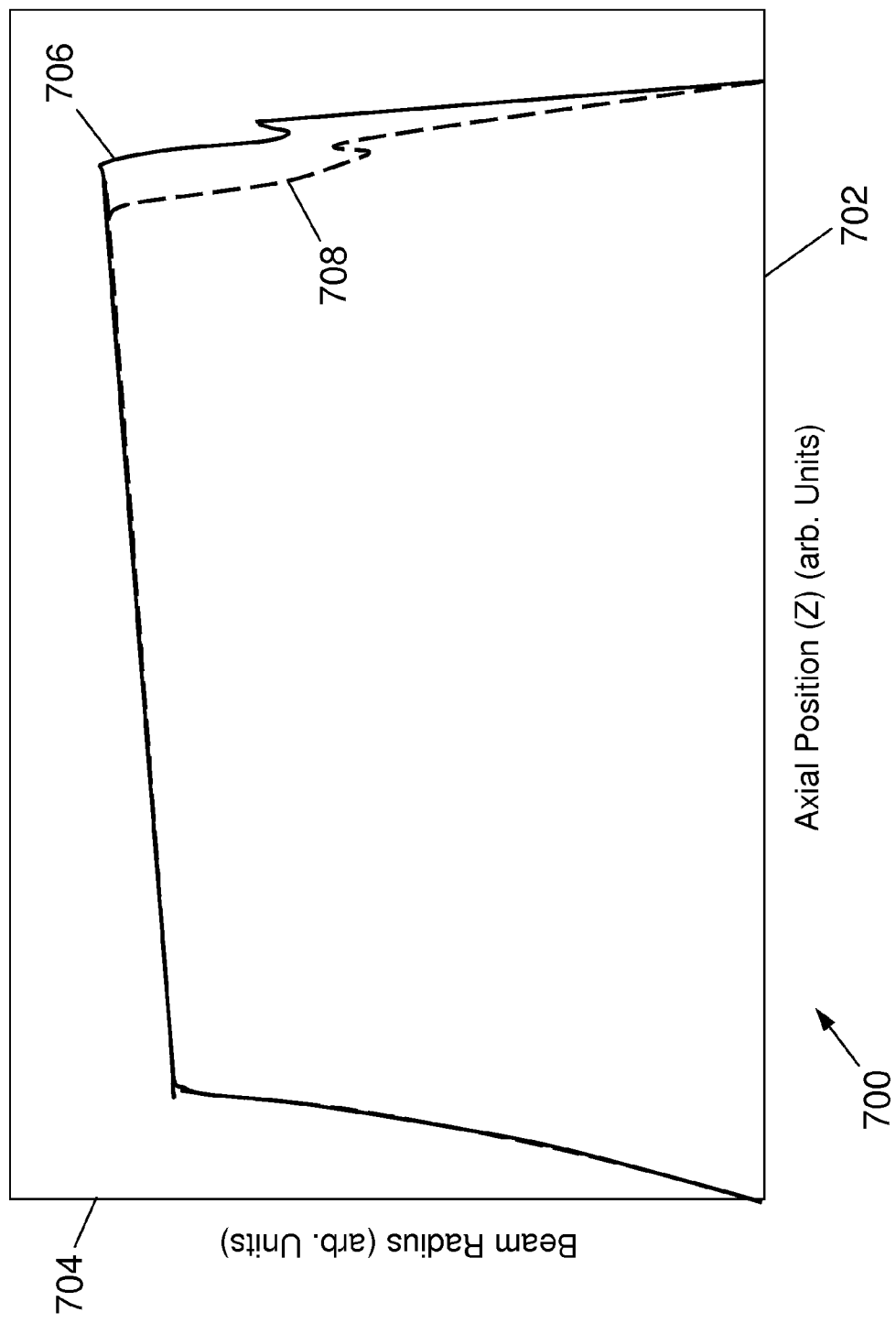
FIG. 7 is a schematic graph of the beam trajectory radius as a function of the axial position in the charged particle column for the prior art charged particle column of FIG. 1 and the charged particle column of FIG. 4.

FIG. 7 is a schematic graph 700 of the beam trajectory radius (in arbitrary units) 704 as a function of the axial position (in arbitrary units) 702 for the prior art charged particle column 100 in FIG. 1 (curve 708) and the charged particle column 400 according to the preferred embodiment of FIG. 4 (curve 706) for a 2 keV beam energy. Note that for this example, the focusing properties of the condenser lens are the same for both ion beams, thus trajectory curves 706 and 708 overlap except at the right of FIG. 7 in the region of the objective lens 110 in FIG. 1 (curve 708) and objective lens 410 in FIG. 4 (curve 706).

Figure 8:
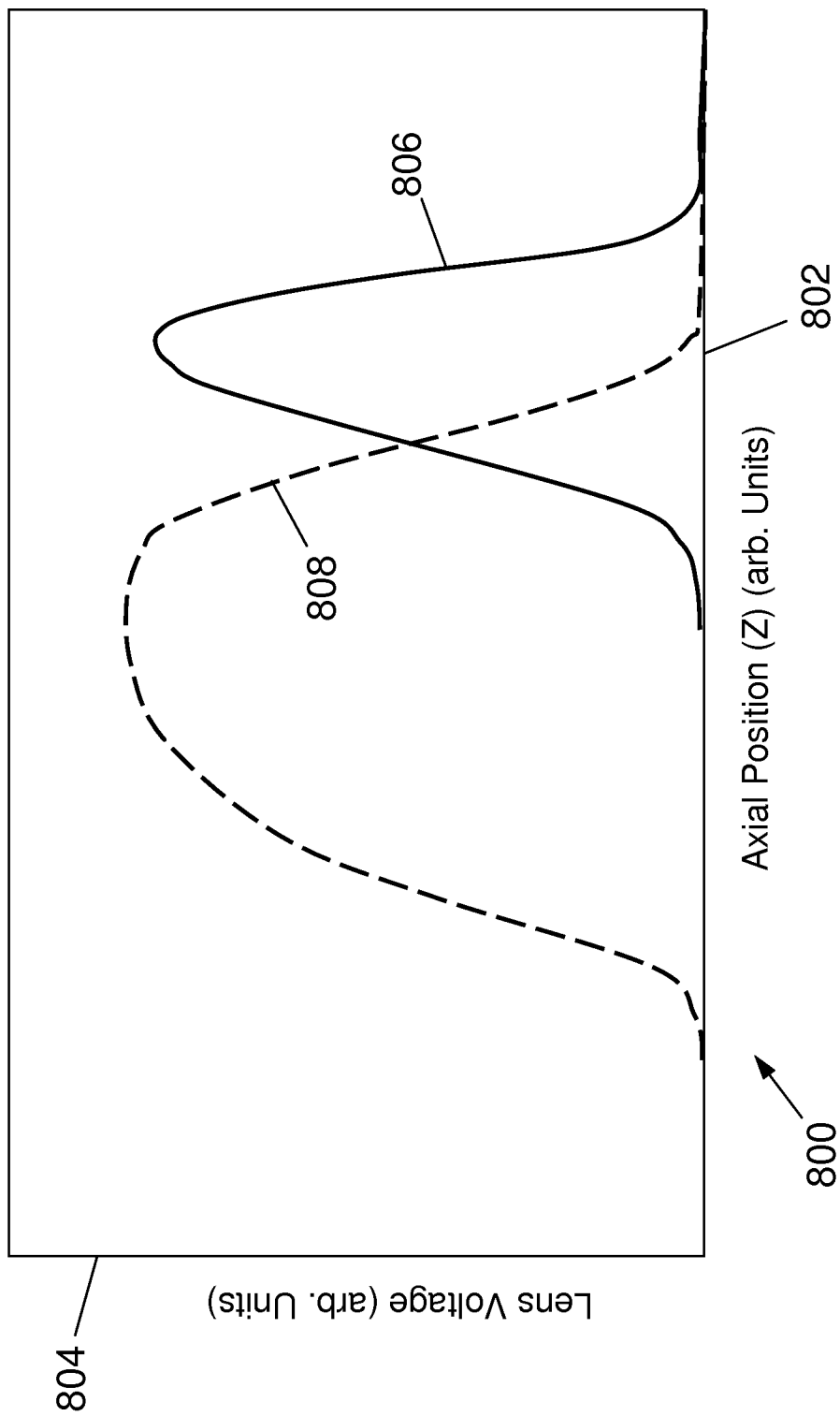
FIG. 8 is a schematic graph of the lens voltage as a function of the axial position in the charged particle column for the prior art charged particle column in FIG. 1 and the charged particle column of FIG. 4.

FIG. 8 is a schematic graph 800 of the axial voltage distribution (in arbitrary units) 804 within the objective lenses 110 and 410 as a function of the axial position z (in arbitrary units) 802 for the prior art charged particle column 100 in FIG. 1 (curve 808) and the charged particle column 400 according to the preferred embodiment of FIG. 4 (curve 806) for a 2 keV beam energy. Since both objective lenses 110 and 410 are einzel lenses referred to ground (i.e., the entrance electrodes 130 and 430, respectively, and exit electrodes 136 and 438, respectively, are at 0 V), the lens voltages in both curves 806 and 808 start and stop at 0 V. The lens polarities (i.e., positive or negative voltages relative to ground, in conjunction with the charge polarity of the beam) determine whether the objective lenses are accelerating or decelerating. Both accelerating and decelerating objective lenses fall within the scope of the invention.

Figure 9:
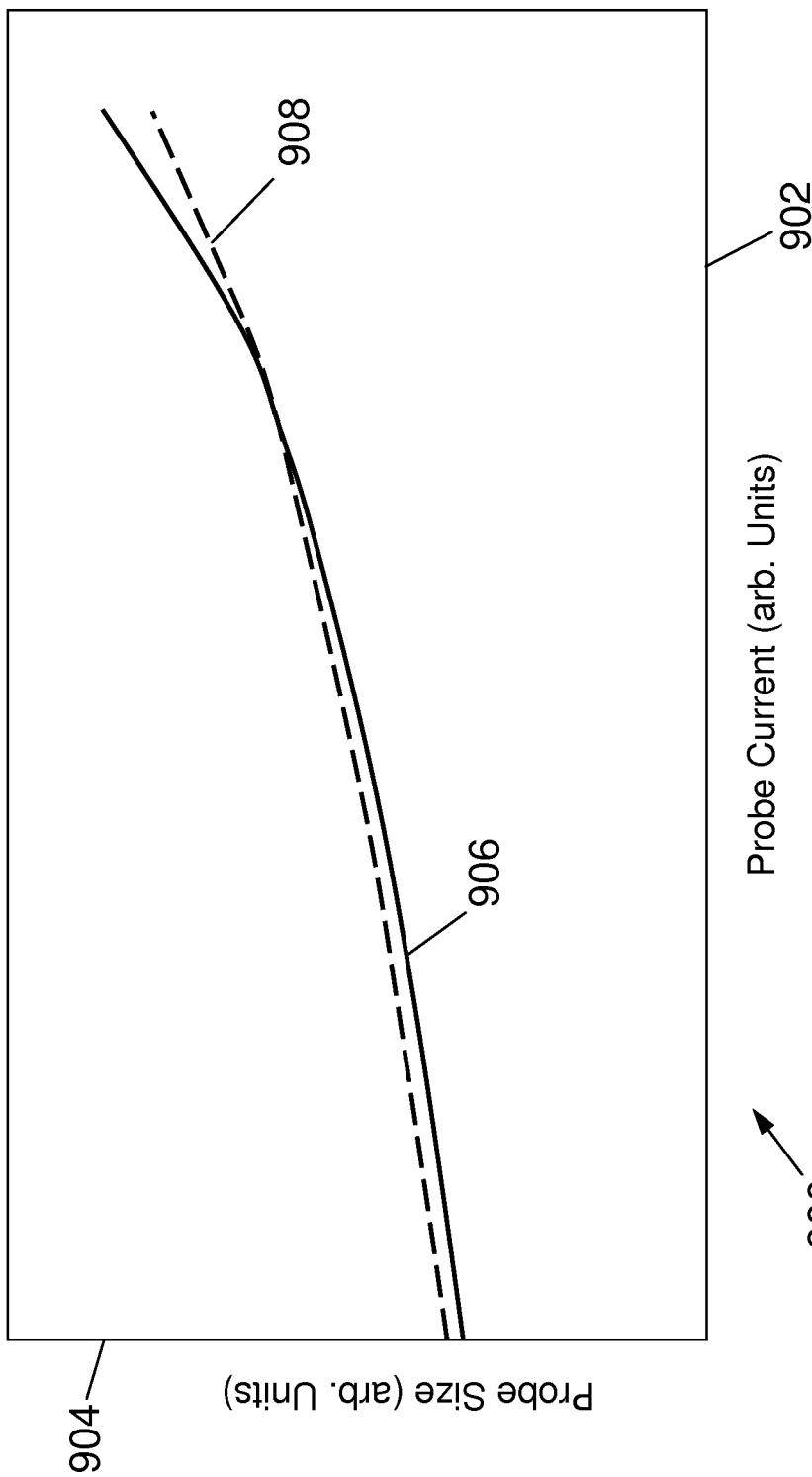
FIG. 9 is a schematic graph of the probe size as a function of the beam (probe) current for the prior art charged particle column in FIG. 1 and the charged particle column of FIG. 4.

FIG. 9 is a schematic graph 900 of the probe size (in arbitrary units) 904 as a function of the beam (probe) current (in arbitrary units) 902 for the prior art charged particle column 100 in FIG. 1 (curve 908) and the charged particle column 400 according to the preferred embodiment of FIG. 4 (curve 906) for a 2 keV beam energy. Note that for lower probe currents, the probe size is smaller for the ion column 400 according to the invention, while for larger probe currents, the prior art column 100 demonstrates smaller probe sizes. Typical beam diameter reductions (comparing column 100 to column 400) at low beam currents may be in the range of 25%.

The schematic diagrams of ion columns according to the preferred embodiments of the invention shown in FIGS. 4-6 are for illustrative purposes only. Other column configurations are possible within the scope of the present invention. Examples include objective lenses with second electrodes 433 comprising a single sub-electrode, or more than two sub-electrodes. Other examples include first 430, third 436, and fourth 438 electrodes with more complex multi-sub-electrode shapes. Methods for determining the required focusing voltages for various ion beam energies are familiar to those skilled in the art.

Although much of the description of the present invention above is directed at an apparatus, it should be recognized that a method of operating the apparatus would further be within the scope of the present invention. Further, it should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention are directed at a charged particle column in an apparatus, such as a FIB or SEM, having improved performance at multiple beam energies. The use of such a column to image or process a target inherently requires that charged particles interact with the sample resulting in some degree of physical transformation. Also, throughout the present specification, discussions utilizing terms such as "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out the present invention are commercially available, for example, from FEI Company, the assignee of the present application.

As used herein, the term "charged particle system" can refer to any apparatus using charged particles to image or process a sample, including a transmission electron microscope (TEM), scanning transmission electron microscope (STEM), scanning electron microscope (SEM), or focused ion beam (FIB) system. The term "ion" may be interpreted to represent either ions (positively- or negatively-charged) or electrons. The term "FIB" or "focused ion beam" is used herein to refer to any collimated ion beam, including a beam focused by ion optics and shaped ion beams.

In the previous discussion and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. The accompanying drawings are intended to aid in understanding the present invention and, unless otherwise indicated, are not drawn to scale.

Although embodiments of the present invention and their advantages have been described in detail, it should be understood that various changes, substitutions and alterations can be made to the embodiments described herein without departing from the spirit and scope of the invention as defined by the appended claims. The voltage source for the grids may come from a single power source and use a voltage divider, separate power sources can be used for each grid, or some combination of voltage drivers and power sources may be used. While the examples provide an electric field to alter the trajectories of the secondary particles, a magnetic field could be used, although the effect of the magnetic field on the primary beam must be considered. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle column for focusing charged particles over a range of energies from a lowest beam energy to a highest beam energy at a target, comprising:
   an optical axis;
   a charged particle source for generating the charged particles, the source being located on the optical axis;
   an objective lens for focusing the charged particles onto the target, the objective lens comprising at least a first electrode, a second electrode, a third electrode, and a fourth electrode, the electrodes arranged sequentially along the optical axis, with the first electrode closest to the charged particle source and the fourth electrode closest to the target, and with a first gap between the first and second electrodes, a second gap between the second and third electrodes, and a third gap between the third and fourth electrodes;
   wherein the first and second gaps are substantially equal and the third gap is no more than ⅓ the size of either the first or second gaps; and
   wherein the first and fourth electrodes are biased to a first voltage by a first voltage supply, and wherein the objective lens is configured to be switchably operated as a three electrode symmetric lens by switchably biasing the second electrode to a second voltage and the third electrode to the first voltage and as a three electrode asymmetric lens by switchably biasing the second electrode to the first voltage and the third electrode to a third voltage.

2. The charged particle column of claim 1, further comprising a second electrode voltage supply and a third electrode voltage supply, wherein the voltage supplies can be used to switch the biases on the second and third electrodes from a first state where the second electrode is biased to the first voltage and the third electrode is biased to the third voltage to a second state where the third electrode is biased to the first voltage and the second electrode is biased to the second voltage.

3. The charged particle column of claim 2, in which switching between the first and second states changes the working distance between the focusing lens and the sample.

4. The charged particle column of claim 1, in which the charged particle column is configured to focus charged particle beams at low beam energy by operating the objective lens as an asymmetric lens in which the second electrode is biased to the first voltage and the third electrode is biased to the third voltage.

5. The charged particle column of claim 1, in which the charged particle column is configured to focus charged particle beams at high beam energy by operating the objective lens as a symmetric lens in which the third electrode is biased to the first voltage and the second electrode is biased to the second voltage.

6. The charged particle column of claim 1 in which the first voltage is ground potential.

7. The charged particle column of claim 1 in which the target is maintained at the first voltage.

8. The charged particle column of claim 1, further comprising a condenser lens for focusing the charged particles from the source into an approximately parallel charged particle beam between the condenser lens and the objective lens.

9. The charged particle column of claim 1, wherein each of the four electrodes is circularly symmetric and centered on the optical axis.

10. The charged particle column of claim 1, wherein the second electrode comprises two or more sub-electrodes, each sub-electrode having a bore centered on the optical axis and positioned along the optical axis in electrical contact with the other sub-electrodes of the two or more sub-electrodes comprised in the second electrode.

11. The charged particle column of claim 10, wherein the second electrode comprises two sub-electrodes, and wherein both sub-electrodes have bores centered on the optical axis, the bore of the first sub-electrode being larger than the bore of the second sub-electrode.

12. The charged particle column of claim 11, wherein the first, third, and fourth electrodes have bores approximately equal to the bore of the second sub-electrode.

13. The charged particle column of claim 9, wherein at least one of the first electrode, the third electrode, or the fourth electrode comprises two or more sub-electrodes, each sub-electrode having a bore centered on the optical axis and positioned along the optical axis in electrical contact with the other sub-electrodes.

14. A charged particle column for focusing charged particles over a range of energies from a lowest beam energy to a highest beam energy at a target, comprising:
   an optical axis;
   a charged particle source for generating the charged particles, the source being located on the optical axis;
   an objective lens for focusing the charged particles onto the target, the objective lens comprising at least a first electrode, a second electrode, a third electrode, and a fourth electrode, the electrodes arranged sequentially along the optical axis, with the first electrode closest to the charged particle source and the fourth electrode closest to the target, and with a first gap between the first and second electrodes, a second gap between the second and third electrodes, and a third gap between the third and fourth electrodes;
   wherein the first and second gaps are substantially equal and the third gap is no more than ⅓ the size of either the first or second gaps; and
   wherein the first and fourth electrodes are substantially biased to a first voltage, and wherein the objective lens is configured to be switchably operated as a three electrode symmetric lens by switchably biasing the second electrode to a second voltage that is substantially different from the first voltage and the third electrode to substantially the first voltage and as a three electrode asymmetric lens by switchably biasing the second electrode to substantially the first voltage and the third electrode to a third voltage that is substantially different from the first voltage.

15. The charged particle column of claim 14 in which substantially biasing any of the first, second, third or fourth electrodes to the first voltage comprises biasing any of the first, second, third, or fourth electrodes to the first voltage plus or minus 200 volts.

16. A charged particle column for focusing charged particles over a range of energies from a lowest beam energy to a highest beam energy at a target, comprising:
   an optical axis;
   a charged particle source for generating the charged particles, the source being located on the optical axis;
   an objective lens for focusing the charged particles onto the target, the objective lens comprising at least a first electrode, a second electrode, a third electrode, and a fourth electrode, the electrodes arranged sequentially along the optical axis, with the first electrode closest to the charged particle source and the fourth electrode closest to the target, wherein the first, second and third electrodes form a symmetric lens, and the second, third and fourth electrodes from an asymmetric lens;
   a first variable voltage supply for biasing the first and fourth electrodes to a first voltage;
   a second variable voltage supply for changing the bias on the second electrode;
   a third variable voltage supply for changing the bias on the third electrode;
   wherein the second and third variable voltage supplies are configured to switchably operate the objective lens as a three electrode asymmetric lens by switchably biasing the second electrode to the first voltage and the third electrode to a voltage different than the first voltage and as a three electrode symmetric lens by switchably biasing the third electrode to the first voltage and the second electrode a voltage different than the first voltage.

17. A method of configuring a charged particle column for improved performance over a wider range of beam energies, the method comprising:
   providing a charged particle beam column according to claim 4;
   determining a desired lower energy for the charged particle beam;
   adjusting the difference in potential between the third electrode and the remaining electrodes and the gap between the third and fourth electrodes to achieve the smallest beam diameter for the desired lower energy;
   reconfiguring the biases on the second and third electrodes so that the third electrode is biased to the first voltage and the second electrode is biased to a different voltage than the first voltage;
   determining a desired higher energy for the charged particle beam, said higher energy being greater than the lower energy by at least a factor of three; and
   adjusting the difference in potential between the second electrode and the remaining electrodes and the gaps between the first and second electrodes and the second and third electrodes to achieve the smallest beam diameter for the desired higher energy.

18. The method of claim 17 in which the adjusted gap between the third and fourth electrodes is no more than $\frac{1}{3}$ the adjusted gaps between the first and second electrodes and the second and third electrodes.

* * * * *